United States Patent
Toprac et al.

(10) Patent No.: US 6,551,751 B2
(45) Date of Patent: Apr. 22, 2003

(54) METHOD AND APPARATUS FOR CONTROLLING A STEPPER

(75) Inventors: Anthony John Toprac, Austin, TX (US); Richard David Edwards, Austin, TX (US); Curtis Warren Doss, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/207,494

(22) Filed: Jul. 29, 2002

(65) Prior Publication Data

US 2002/0186358 A1 Dec. 12, 2002

Related U.S. Application Data

(62) Division of application No. 09/726,995, filed on Nov. 30, 2000, now Pat. No. 6,440,622.

(51) Int. Cl.[7] .......................... G03F 9/00; G03B 27/42; G01J 1/42
(52) U.S. Cl. .......................... 430/30; 355/53; 356/218; 382/152
(58) Field of Search .............................. 430/30; 355/53; 356/218; 382/152

(56) References Cited

U.S. PATENT DOCUMENTS 6,440,622 B1 * 8/2002 Toprac et al. ................. 430/30

* cited by examiner

*Primary Examiner*—Christopher G. Young
(74) *Attorney, Agent, or Firm*—Williams, Morgan & Amerson

(57) ABSTRACT

In one illustrative embodiment, a method is provided that comprises energizing a light source to provide light having a preselected intensity. A first photosensor, which is capable of delivering a first signal indicative of the intensity of the light source, is exposed to the light source. A second photosensor, which is also capable of delivering a second signal indicative of the intensity of the light source, is also exposed to the light source. Thereafter, the first and second signals are compared, and an error signal is delivered in response to detecting a significant difference between the first and second signals.

13 Claims, 6 Drawing Sheets

METHOD AND APPARATUS FOR CONTROLLING A STEPPER

This is a divisional of application Ser. No. 09/726,995 filed Nov. 30, 2000, now U.S. Pat. No. 6,440,622.

BACKGROUND OF THE INVENTION

1. Field of the Invention

The present invention is generally related to the field of semiconductor processing, and, more particularly, to a method and apparatus for controlling the amount of light energy delivered to a layer of photoresist on a semiconductor device.

2. Description of the Related Art

In general, semiconductor devices are manufactured by forming many process layers comprised of various materials above a semiconducting substrate, and, thereafter, removing selected portions of the layers, i.e., patterning the layers. This patterning may be accomplished using known photolithography and etching processes to define the various features of the device, e.g., a gate insulation layer, a gate electrode, sidewall spacers, metal lines and contacts, etc. This forming and patterning of the process layers is typically performed layer by layer as the individual layers are formed, although multiple layers may be patterned at any given time.

Photolithography is a common process used in patterning these various layers. Photolithography typically involves the use of a product known as photoresist. In general terms, photoresist is a product that may be changed from a relatively soluble state to a relatively insoluble state by exposure to a light source. There are positive and negative photoresist currently available on the market.

The photolithography process generally involves forming a layer of photoresist above a previously formed process layer, and exposing selected portions of the layer of photoresist to a light source to form a pattern in the photoresist. The pattern formed in the photoresist is subsequently transferred to the underlying process layer. All of these steps are typically performed in well-known photolithography modules that include a section for depositing the photoresist on the wafer, e.g., a spin-coating station, a device for selectively exposing portions of the photoresist layer to a light source through a reticle, e.g., a stepper, and a section for rinsing and developing the photoresist layer after it has been selectively exposed to the light source. Thereafter, an etching process, such as a plasma etching process, is performed to remove portions of the underlying process layer that are not covered by the patterned layer of photoresist, i.e., the patterned layer of photoresist acts as a mask. After the etching process is complete, the patterned photoresist layer is typically removed so that additional process layers may be formed above the now patterned process layer.

The purpose of the photoresist application step is to form a thin, uniform, defect-free film of photoresist above the substrate surface. A typical layer of photoresist may have a thickness varying from approximately 1500–15,000 Å, and it usually is required to have a uniformity of ±100 Å. Typically, the photoresist is developed by exposing it to a light source of a preselected intensity for a preselected duration of time. Overexposure or underexposure may have undesirable effects on the developed layer of photoresist. That is, dimensions of the patterns formed in the photoresist may be affected by other than ideal exposure. This dimensional variation may carry over to the features that are to be formed in the semiconductor device, and, thus, affect the operation of the semiconductor device, or in the worst case render it inoperable.

Steppers commonly include a light source that is normally on, and a shutter positioned between the light source and the semiconductor device. Thus, exposure of the semiconductor device to the light source is controlled by opening and closing the shutter. For a given light intensity, the duration that the shutter needs to be open may be readily calculated or otherwise derived. However, the light source tends to degrade over time, usually resulting in the shutter being held open for longer and longer periods of time. Typically, a photodose sensor, such as a photodiode, is disposed in the stepper near the semiconductor device. The photodose sensor measures the intensity of the light source, which can be used to determine a corresponding duration for which the shutter is held open.

Unfortunately, the photodose sensor, like the light source, also tends to degrade over time. That is, repeated exposure of the photodose sensor to the light source reduces the magnitude of its output in response to exposure to the same light intensity. Degradation of the photodose sensor may result in the shutter being held open for longer periods of time, overexposing the layer of photoresist, which may adversely affect feature size, particularly critical dimensions (CD).

The present invention is directed to a method of solving or at least reducing some or all of the aforementioned problems.

SUMMARY OF THE INVENTION

In one embodiment, the present invention is directed to a method. The method comprises energizing a light source to provide light having a preselected intensity. A first photosensor, which is capable of delivering a first signal indicative of the intensity of the light source, is exposed to the light source. A second photosensor, which is also capable of delivering a second signal indicative of the intensity of the light source, is also exposed to the light source. Thereafter, the first and second signals are compared, and an error signal is delivered in response to detecting a significant difference between the first and second signals.

In another embodiment of the instant invention a method for controlling a stepper is provided. The method comprises providing a wafer having a layer of photoresist disposed thereon, and energizing a light source to deliver light having a preselected intensity onto the layer of photoresist for a preselected duration of time. A first photosensor is exposed to the light source, wherein the first photosensor is capable of delivering a first signal indicative of the intensity of the light source. Similarly, a second photosensor is exposed to the light source, wherein the second photosensor is capable of detecting the intensity of the light source. Thereafter, the first and second signals are compared to determine a difference therebetween, and the preselected duration of time is determined as a function of the difference between the first and second signals.

In still another embodiment of the instant invention, a stepper is provided. The stepper comprises a light source capable of providing light having a preselected intensity. A first photosensor is capable of delivering a first signal indicative of the intensity of the light source. A second photosensor is also capable of delivering a second signal indicative of the intensity of the light source. A controller is adapted to compare the first and second signals, and deliver an error signal in response to detecting a significant difference between the first and second signals.

BRIEF DESCRIPTION OF THE DRAWINGS

The invention may be understood by reference to the following description taken in conjunction with the accompanying drawings, in which like reference numerals identify like elements, and in which.

Figure 1:
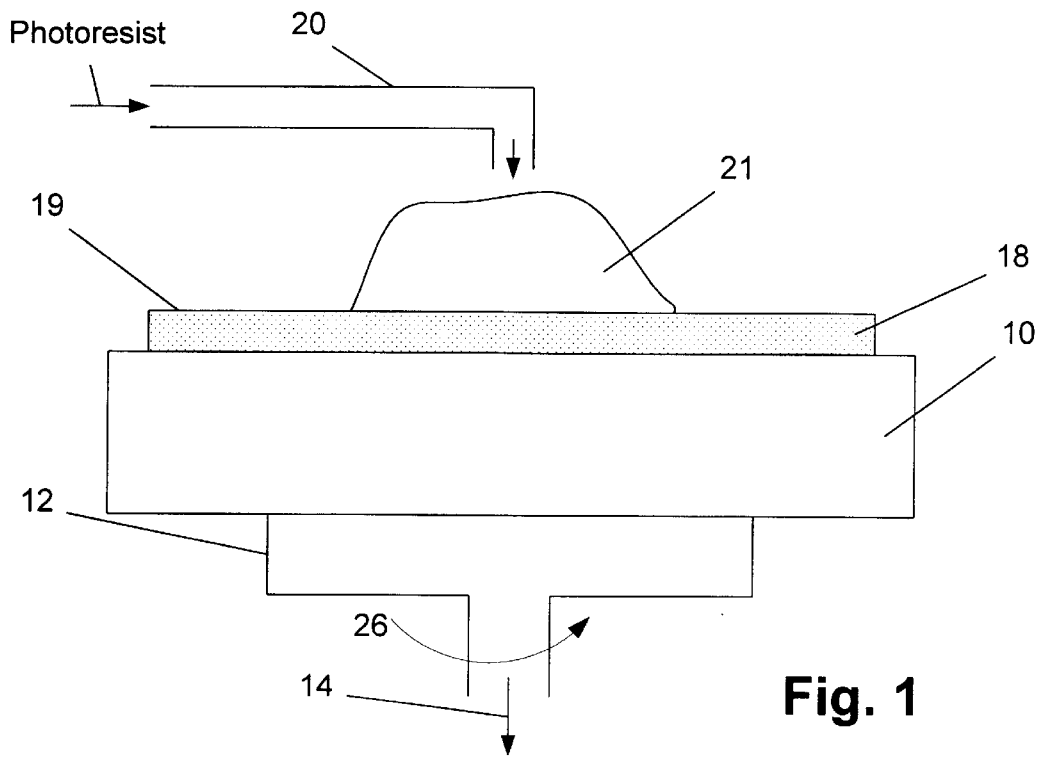
FIG. 1 is a cross-sectional view of a process whereby a quantity of photoresist is positioned on a previously formed process layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–7. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features on fabricated devices. Nevertheless, the attached drawings are included to describe and explain illustrative examples of the present invention.

In general, the present invention is directed to a method of detecting and/or compensating for drifting intensity of a light source used in a stepper in a semiconductor manufacturing line. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
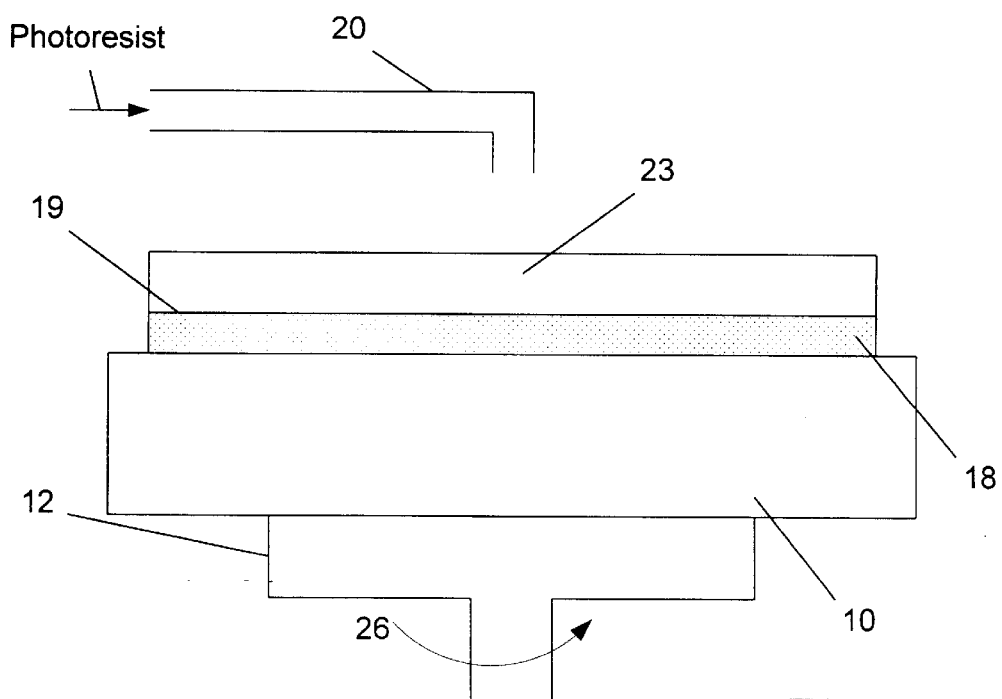
FIG. 2 is a cross-sectional view of a layer of photoresist formed by a spin-coating process.

As shown in FIG. 1, a wafer or semiconducting substrate 10 having a process layer 18 formed thereabove is positioned on a rotational element, such as a vacuum chuck 12. A vacuum may be applied, as indicated by arrow 14, to secure the substrate 10 to the vacuum chuck 12. The vacuum chuck 12 and the substrate 10 are capable of being rotated in the direction indicated by arrow 26. Photoresist from a source (not shown) is applied on the process layer 18 via a dispenser arm 20. As shown in FIG. 1, a puddle of photoresist 21 is formed above the process layer 18. The substrate 10 may or may not be rotating at the time the puddle of photoresist 21 is deposited on the process layer 18. Thereafter, as shown in FIG. 2, the substrate 10 is rotated such that the photoresist material is spread across a surface 19 of the process layer 18, forming a layer of photoresist 23 above the surface 19 of the process layer 18.

As will be recognized by those skilled in the art, the process layer 18 is meant to be illustrative only in that it may be comprised of any of a variety of materials, and there may be one or more intervening process layers between the process layer 18 and the substrate 10. For example, the process layer 18 may be comprised of an oxide, an oxynitride, a nitride, silicon dioxide, silicon nitride, a metal, polycrystalline silicon ("polysilicon"), or any other of a variety of materials used in semiconductor processing that may be patterned using photolithographic techniques. Moreover, the photoresist used with the present invention may be either a positive or negative type photoresist.

In the disclosed embodiment, the layer of photoresist 23 is formed by a spin-coating process. In many modern fabrication facilities, a spin-coating process involving a moving dispenser arm 20 is used to form layers of photoresist. In that process, the substrate 10 is rotated at a relatively low speed prior to the deposition of any photoresist material 21 on the process layer 18. As the photoresist material 21 is deposited on the substrate 10, the dispenser arm 20 moves in a more or less radially outward fashion, beginning at the center of the substrate 10 and moving outward. This technique is used to more evenly distribute the photoresist across the surface 19 of the process layer 18.

Of course, as will be apparent to those skilled in the art upon reading the present application, the present invention is not limited to this particular spin-coating technique. For example, the present invention may also be used in processing techniques in which the dispenser arm 20 remains at the approximate center of the substrate 10. In that situation, the substrate 10 is initially rotated at a relatively low speed and photoresist material 21 is dispensed on the approximate center of the process layer 18. At that time, the rotational speed of the substrate is increased to disperse the photoresist. In yet another alternative embodiment, a static-type spin-coating process may be used in which the photoresist material 21 is deposited in the approximate center of a process layer 18 while the process layer 18, i.e., the substrate 10, is stationary. Thereafter, the substrate 10 is rotated to disperse the photoresist evenly across the surface 19 of the process layer 18. If desired or required, a separate primer coating process may also be used prior to applying the photoresist above the process layer 18 in any of the above-described spin-coating methods.

Figure 3:
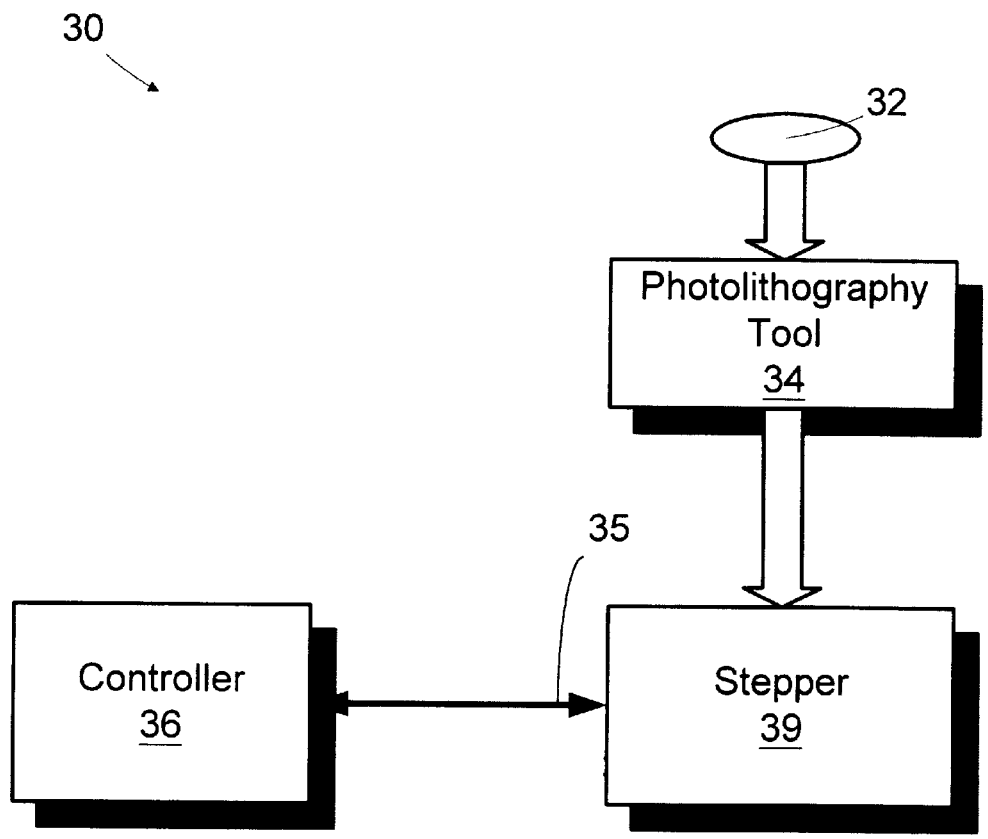
FIG. 3 depicts one illustrative embodiment of a system that may be employed with the present invention.

FIG. 3 depicts one illustrative embodiment of a system 30 that may be used with the present invention to process wafers 32. As shown therein, the system 30 is comprised of a photolithography tool 34 used for forming the layer of photoresist 23, an automatic process controller 36, and a stepper 39 for controllably exposing the layer of photoresist 23 to a light source. The controller 36 may take a variety of forms. For example, the controller 36 may be included within the stepper 39, or it may be a separate device electrically coupled to the stepper 39 via a line 35. In the embodiment illustrated herein, the controller 36 takes the form of computer that is controlled by a variety of software programs. The software programs that directly relate to controlling and or monitoring the light source within the stepper 39 are discussed in greater detail below in conjunction with FIGS. 5 and 6. Those of ordinary skill in the art will appreciate that the controller 36 need not rely on software for its functionality, but rather, a hardware controller may be used to provide the functionality described herein and attributed to the controller 36. Further, the controller 36 need not be coupled only to the stepper 39, but rather, could be coupled to and involved in controlling or collecting data from the photolithography tool or other devices involved in the manufacture of semiconductor devices.

Figure 4:
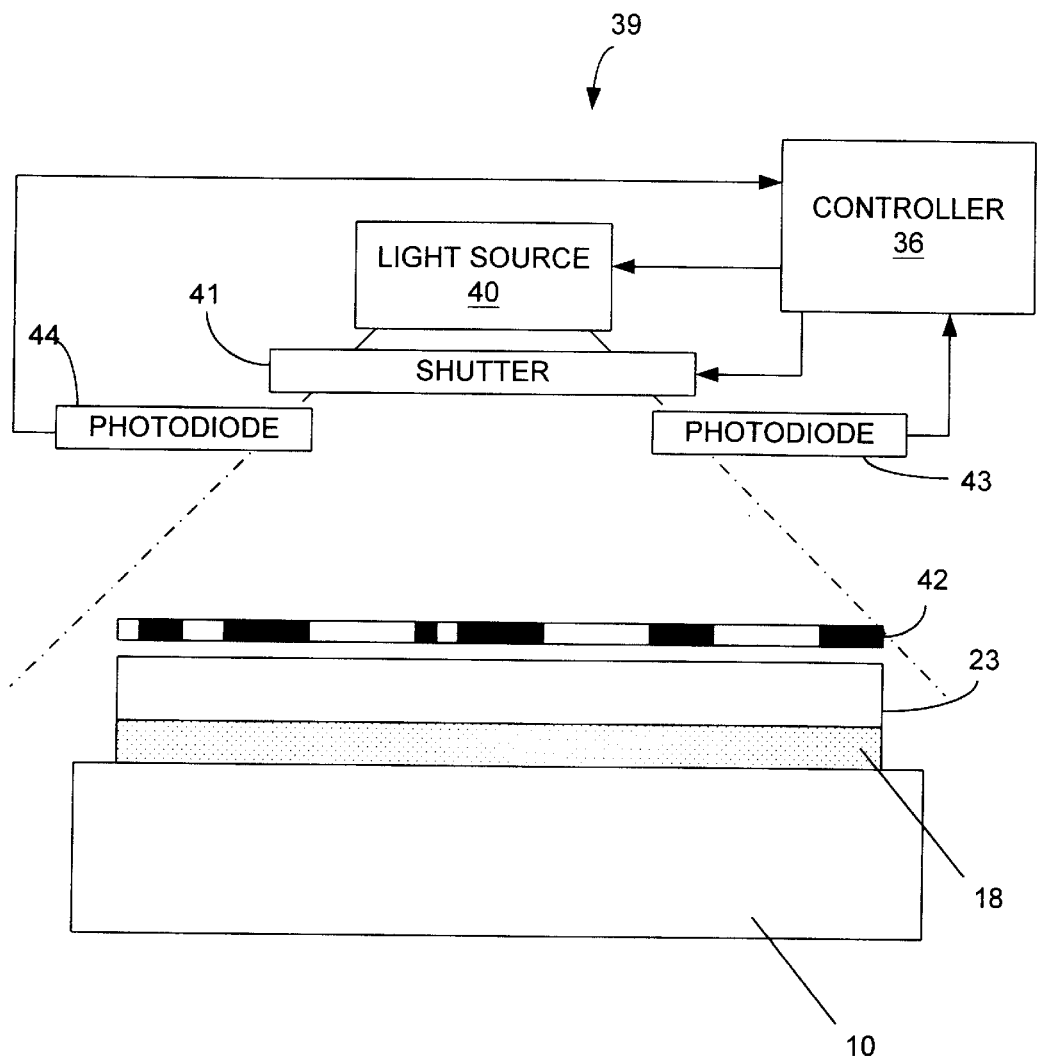
FIG. 4 illustrates a stylized view of operative components of a stepper of FIG. 3.

The stepper 39 may be any of a wide variety of devices used to expose the layer of photoresist 23 to a light source, e.g., an ASML/500 manufactured by ASML. Generally, as shown in FIG. 4, the stepper 39 includes a plurality of operational components. A light source 40 is positioned above the substrate 10 with a shutter 41 interposed there between. Generally, the shutter 41 is operated by the controller 36 between open and closed positions. In the open position, light energy from the light source 40 passes through the shutter 41 and a mask or reticle 42 to impinge upon the layer of photoresist 23. Alternatively, when the shutter 41 is closed, substantially no light energy from the light source 40 reaches the layer of photoresist 23.

A photodose sensor, such as a photodiode 43, is positioned to receive light energy from the light source 40 and provide a signal indicative of the light intensity to the controller 36. The light intensity signal is used by the controller 36 in one embodiment as at least one parameter for controlling the shutter 41 and/or providing an indication of when the light source 40 should be replaced. The photodiode 43 may be positioned on either side of the shutter 41 to receive light energy from the light source 40 during at least the time that the shutter 41 is open, and in some instances, at all times.

The photodose sensor 43 may take on any of a variety of forms and may be an array of sensors adapted to detect the presence and/or magnitude of select frequencies of light. That is, an array of sensors may have optic filters (not shown) configured to allow selective frequencies of light to fall upon selected sensors and/or groups of sensors within the array. Thus, variations in the magnitude of the detected frequencies of the light source 40 may be detected and used as an indication that the photodose sensor 43 needs to be replaced or that control of the shutter 36 needs to be varied.

In an alternative embodiment of the instant invention, a second photodose sensor, such as a photodiode 44, is positioned to receive light energy from the light source 40 and provide a signal indicative of the light intensity to the controller 36. The light intensity signal is used by the controller 36 in one embodiment as at least one parameter for determining when the photodiode 43 and/or the light source 40 should be replaced. The photodiode 44 may be positioned on either side of the shutter 41 to receive light energy from the light source 40 during at least a portion of the time that the photodiode 43 receives light energy from the light source 40. It may be advantageous to position or otherwise locate the photodiodes 43, 44 near one another, or locate them to receive similar doses of light.

The present invention may be employed on a lot-by-lot basis and/or on a wafer-by-wafer basis. In general, the more frequent the measurements, the more accurate will be the light energy delivered to the layer of photoresist 23. That is, the intensity of the light source 40 need not be measured at each exposure, but rather, a previous measurement may be used by the controller 36 to time the opening and closing of the shutter 41. The number of wafers processed between measurements is a matter of design discretion, which depends substantially on the details of the particular embodiment.

In the illustrated embodiment, the automatic process controller 36 is a computer programmed with software to implement the functions described. However, as will be appreciated by those of ordinary skill in the art, a hardware controller (not shown) designed to implement the particular functions may also be used. Moreover, the functions of the controller described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 36, as described, is the KLA Tencor Catalyst system offered by KLA Tencor, Inc. The KLA Tencor Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 5:
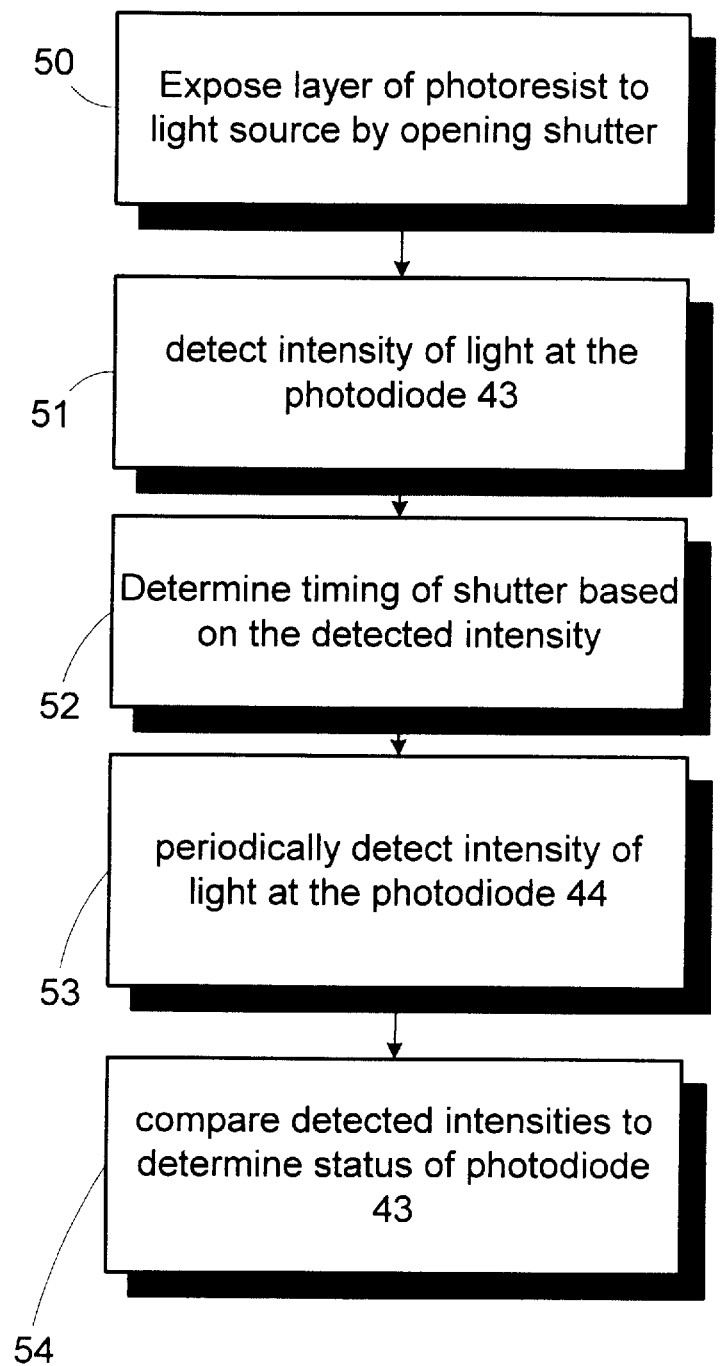
FIG. 5 depicts one illustrative embodiment of the present invention in flowchart form.

Referring to FIG. 5, one illustrative embodiment of the present invention is depicted in flowchart form. As shown therein, the present invention comprises a process that begins at block 50 with the layer of photoresist 23 being exposed to the light source 40 by, for example, opening the shutter 41. In block 51, the photodiode 43 detects the intensity of the light and delivers a signal having a magnitude representative thereof to the controller 36. The detected intensity is used in block 52 to determine the amount of time that the shutter 41 should be held open to deliver an appropriate dose of light energy to the layer of photoresist 23. A variety of mechanisms may be used to determine the amount of time that the shutter 41 should be held open. For example, a look up table may be stored in memory and accessed using the detected intensity of the light source 40. Alternatively, an algorithm that employs the detected intensity of the light source 40 as a variable may be used to calculate the amount of time that the shutter 41 should be held open.

Periodically, in block 53, the photodiode 44 is also used to detect the intensity of the light, and likewise delivers a signal having a magnitude representative thereof to the controller 36. The period at which the photodiode 44 is used to detect the light intensity is a matter of design discretion. For example, it may be useful in some situations to detect the light intensity at the photodiode 44 every tenth time that the photodiode 43 is used to detect light intensity. That is, the photodiode 43 will be used at a rate of about ten times that of the photodiode 44. Thus, the substantially higher usage of the photodiode 43 should result in its output signal degrading substantially sooner than that of the photodiode 44. Accordingly, in block 54 the detected intensities of the photodiodes 43, 44 are compared. A significant variation in the magnitude of the output signals of the photodiodes 43, 44 can serve as an indication that the operation of the photodiode 43 has degraded and should be replaced. Alternatively, the difference between the magnitudes of the two signals may be used to calculate a correction factor that can be applied to the output signal of the photodiode 43 before it is used to calculate the timing of the shutter 41.

Despite the significantly lower usage rate, the operation of the photodiode 44 will also begin to degrade, and should also be replaced. One method for determining when to replace the photodiode 44 would be to compare the output signal of the "old" photodiode 44 with the output signal of a newly replaced photodiode 43. Any significant variation at that time may be used as an indicator that the photodiode 44 should be replaced. Alternatively, any variation may be used to calculate a correction factor, which could be applied to one of the output signals before the comparison of block 54 is performed.

Figure 6:
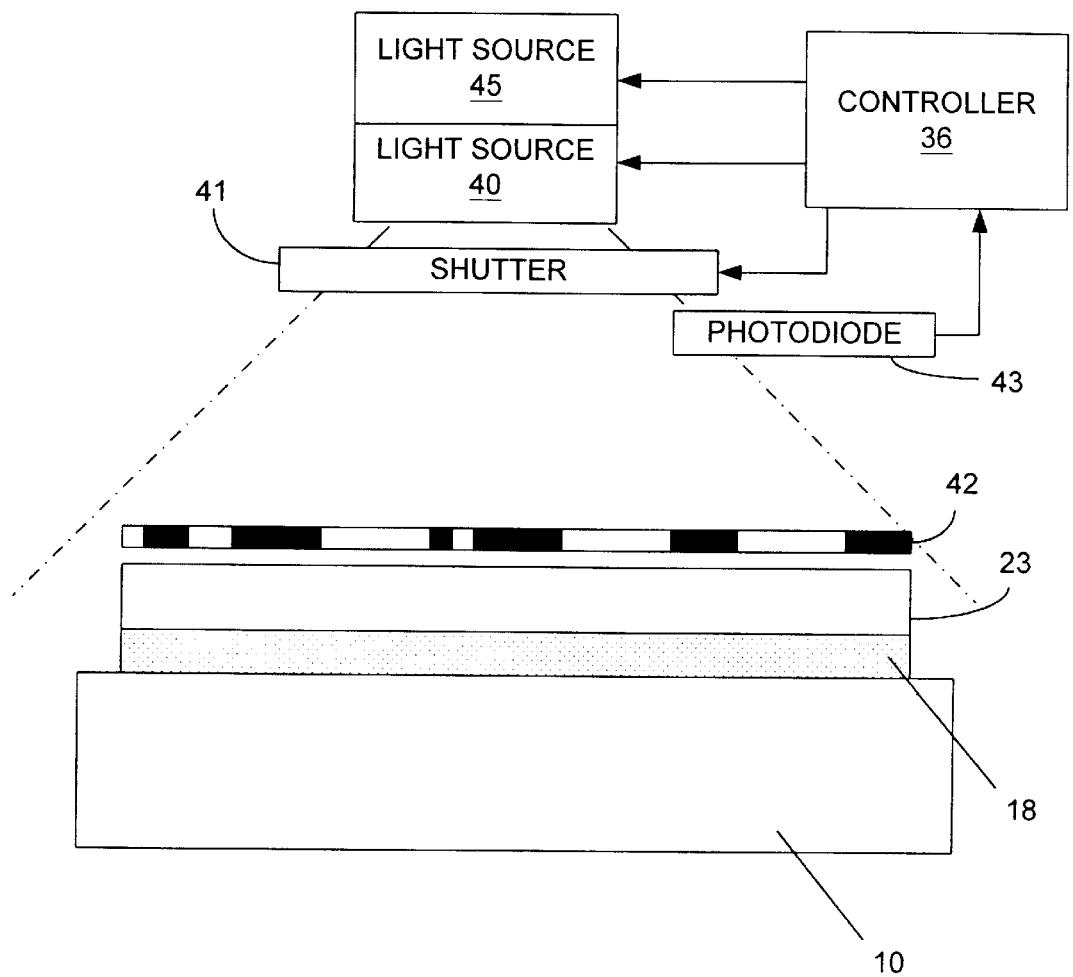
FIG. 6 illustrates a stylized view of operative components of an alternative embodiment of the stepper of FIG. 3.

In an alternative embodiment illustrated in FIG. 6, the system differs in two primary respects. First, a second light source 45 is positioned to cause light to fall on the photodiode 43. Second, the second photodiode 44 is no longer required in this embodiment. In the stylized drawing of FIG. 6, the light source 45 is positioned behind the shutter 41 so that the shutter 41 must be open for light from the light source 45 to fall upon the photodiode 43. However, in some applications it may be useful for the light source 45 to be positioned so that light falls directly on the photodiode 43.

Figure 7:
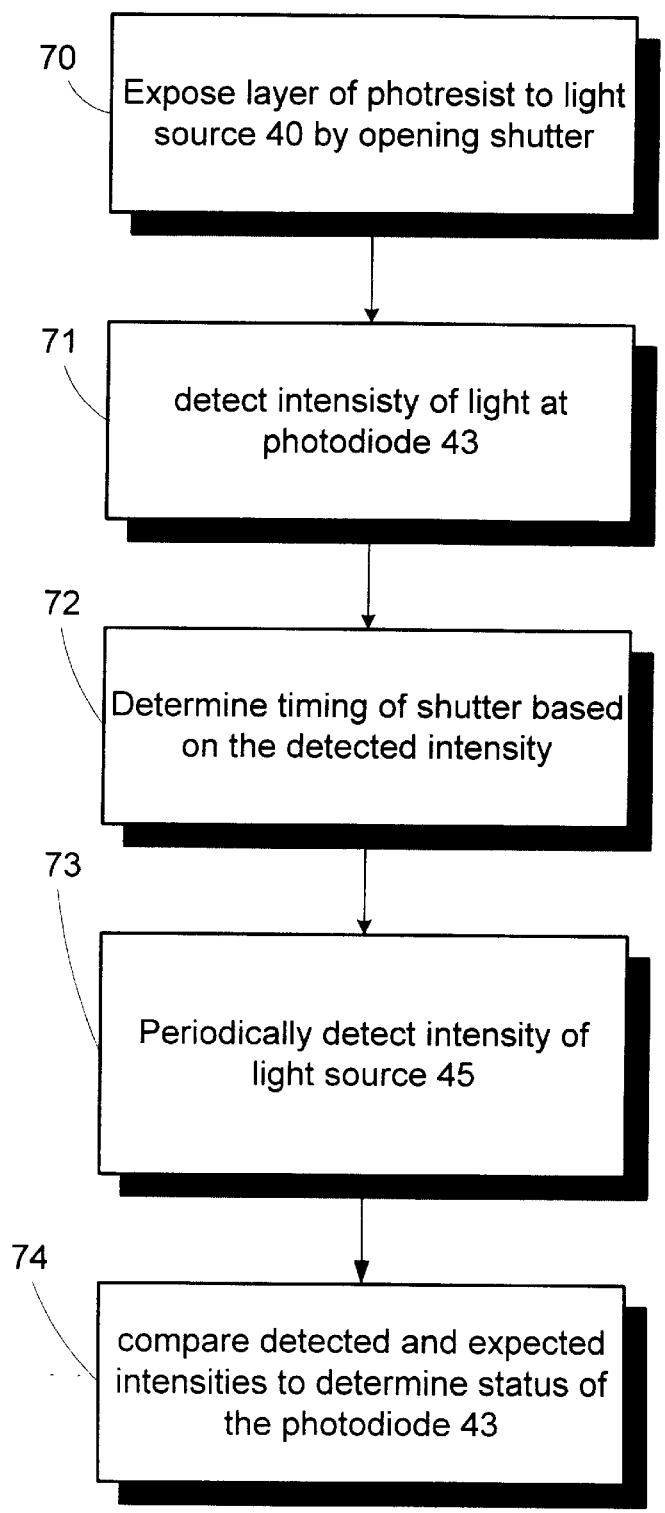
FIG. 7 depicts one illustrative embodiment of the present invention in flowchart form.

Referring to FIG. 7, one illustrative embodiment of the present invention that operates in conjunction with the system shown in FIG. 6 is depicted in flowchart form. As shown therein, the present invention comprises a process that begins at block 70 with the layer of photoresist 23 being exposed to the light source 40 by, for example, opening the shutter 41. In block 71, the photodiode 43 detects the intensity of the light and delivers a signal having a magnitude representative thereof to the controller 36. The detected intensity is used in block 72 to determine the amount of time that the shutter 41 should be held open to deliver an appropriate dose of light energy to the layer of photoresist 23.

Periodically, in block 73, the light source 45 is energized to deliver a known intensisty of light to the photodiode 43. The photodiode 43 responds to the intensity of the light source 45 by delivering a signal having a magnitude representative thereof to the controller 36. The period at which the light source 45 is energized is a matter of design discretion. For example, it may be useful in some situations to detect the light intensity from the light source 45 every tenth time that the light source 40 is energized. That is, the light source 40 will be used at a rate of about ten times that of the light source 45.

In block 74, the detected intensity of the light source 45 is compared to a "known" or expected intensity. A significant variation between the detected and expected intensities may be used as a basis for generating an error signal, indicating that the operation of the photodiode 43 has degraded and should be replaced. Alternatively, the difference between the two signals may be used to calculate a correction factor that can be used to further vary the timing of the shutter 41.

The light source 45 may be tuned to a preselected frequency or frequency spectrum that may be detected by the photodiode 43. The expected and detected intensities may reflect the magnitude of a preselected frequency or frequency spectrum, as seen by the photodiode 43. That is, the photodiode 43 may return a signal indicating the overall or average magnitude of the light delivered by the light source 45, or may deliver a signal(s) that indicates the magnitude of each discrete frequency within the frequency spectrum. Thus, the comparison that occurs in block 74 may take on a variety of forms, such as simply comparing the overall or average magnitude, or comparing the magnitude of discrete frequencies within the frequency spectrum. A significant shift in the detected response of the photodiode 43, whether it is a change in magnitude or a shift in frequency sensitivity, may be used to indicate to an operator that the photodiode 43 should be replaced.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus, comprising:
    means for energizing a light source to provide light having a preselected intensity;
    means for exposing a first photosensor to the light source, wherein the first photosensor is capable of delivering a first signal indicative of the intensity of the light source;
    means for exposing a second photosensor to the light source, wherein the second photosensor is capable of detecting the intensity of the light source;
    means for comparing the first and second signals;
    means for delivering an error signal in response to detecting a difference of a preselected magnitude between the first and second signals.

2. A stepper, comprising:
    a light source capable of providing light having a preselected intensity;
    a first photosensor capable of delivering a first signal indicative of the intensity of the light source;

a second photosensor capable of delivering a second signal indicative of the intensity of the light source; and a controller adapted to compare the first and second signals, and deliver an error signal in response to detecting a difference of a preselected magnitude between the first and second signals.

3. A stepper, as set forth in claim 2, wherein the controller delivers the error signal indicating that the first photosensor requires servicing.

4. A stepper, as set forth in claim 2, wherein the controller delivers the error signal indicating that the first photosensor should be replaced.

5. A stepper, as set forth in claim 2, wherein the controller is further adapted to expose the first photosensor at a first preselected rate to the light source, and expose the second photosensor at a second preselected rate to the light source, wherein the first preselected rate is greater than the second preselected rate.

6. A stepper, as set forth in claim 2, wherein the first and second photosensors are capable of respectively delivering first and second signals having a magnitude indicative of the intensity of the light source, and wherein the controller compares the magnitudes of the first and second signals.

7. A stepper, as set forth in claim 2, wherein the first and second photosensors are capable of respectively delivering first and second signals having an indication of the magnitude of a plurality of discrete frequencies within a preselected frequency spectrum of the light source, and wherein the controller compares the magnitudes of the plurality of discrete frequencies of the first and second signals.

8. An apparatus, comprising:

means for energizing a first light source to provide light having a first preselected intensity;

means for exposing a photosensor to the first light source, wherein the photosensor is capable of delivering a first signal indicative of the intensity of the first light source;

means for controlling a duration that the first light source is energized based on the first signal;

means for periodically energizing a second light source to provide light having a second preselected intensity;

means for exposing the photosensor to the second light source, wherein the photosensor is capable of delivering a second signal indicative of the intensity of the second light source;

means for comparing the second signal with a preselected setpoint; and means for delivering an error signal in response to detecting a difference of a preselected magnitude between the second signal and the preselected setpoint.

9. A stepper, comprising:

a first light source capable of providing light having a first preselected intensity;

a second light source capable of providing light having a second preselected intensity;

a photosensor capable of delivering a first signal indicative of the intensity of the first light source and a second signal indicative of the intensity of the second light source; and a controller adapted to compare the second signal with a preselected setpoint, and deliver an error signal in response to detecting a difference of a preselected magnitude between the second signal and the preselected setpoint.

10. A stepper, as set forth in claim 9, wherein the controller delivers the error signal indicating that the photosensor requires servicing.

11. A stepper, as set forth in claim 9, wherein the controller delivers the error signal indicating that the photosensor should be replaced.

12. A stepper, as set forth in claim 9, wherein the controller is further adapted to energize the first light source at a first preselected rate, and energize the second light source at a second preselected rate, wherein the first preselected rate is greater than the second preselected rate.

13. A stepper, as set forth in claim 9, wherein the photosensor is capable of delivering the second signal having an indication of the magnitude of a plurality of discrete frequencies within a preselected frequency spectrum of the second light source, and wherein the controller compares the magnitudes of the plurality of discrete frequencies of the second signal with the preselected setpoint.

* * * * *